(12) United States Patent
Zochios

(10) Patent No.: US 7,286,015 B2
(45) Date of Patent: Oct. 23, 2007

(54) LINEAR-IN-DB VARIABLE GAIN AMPLIFIERS WITH AN ADAPTIVE BIAS CURRENT

(75) Inventor: Gerasimos Zochios, Athens (GR)

(73) Assignee: Theta Microelectronics, Inc., San Jose, CA (US)

( * ) Notice: Subject to any disclaimer, the term of this patent is extended or adjusted under 35 U.S.C. 154(b) by 113 days.

(21) Appl. No.: 11/311,572

(22) Filed: Dec. 19, 2005

(65) Prior Publication Data

US 2006/0132237 A1    Jun. 22, 2006

Related U.S. Application Data

(60) Provisional application No. 60/636,551, filed on Dec. 17, 2004.

(51) Int. Cl.
*H03F 3/45* (2006.01)

(52) U.S. Cl. .................................. 330/254; 330/278
(58) Field of Classification Search .............. 330/254, 330/278, 257, 261
See application file for complete search history.

(56) References Cited

U.S. PATENT DOCUMENTS

| | | | |
|---|---|---|---|
| 4,415,864 A | 11/1983 | Boeke | |
| 5,572,166 A | 11/1996 | Gilbert | |
| 5,684,431 A | 11/1997 | Gilbert et al. | |
| 6,163,198 A | 12/2000 | Cargill | |
| 6,456,142 B1 | 9/2002 | Gilbert | |
| 6,563,383 B1 | 5/2003 | Otaka et al. | |
| 6,583,667 B1 | 6/2003 | Dasgupta et al. | |
| 6,734,736 B2 | 5/2004 | Gharpurey | |
| 6,903,608 B2 * | 6/2005 | Whittaker et al. | 330/254 |
| 6,930,549 B2 * | 8/2005 | Kajiwara et al. | 330/254 |
| 7,154,331 B2 * | 12/2006 | Zaguri | 330/254 |
| 2004/0097214 A1 | 5/2004 | Gard et al. | |
| 2004/0113683 A1 | 6/2004 | Ogita et al. | |

* cited by examiner

*Primary Examiner*—Henry Choe
(74) *Attorney, Agent, or Firm*—Blakely, Sokoloff, Taylor & Zafman LLP

(57) ABSTRACT

Linear-in-dB current-steering VGAs with an adaptive bias current operable so that as the gain of the amplifier decreases, the DC current consumption also decreases. The modified VGA circuits result in power consumption savings, which are of particular value in wireless (battery powered) applications.

14 Claims, 2 Drawing Sheets

LINEAR-IN-DB VARIABLE GAIN AMPLIFIERS WITH AN ADAPTIVE BIAS CURRENT

CROSS-REFERENCE TO RELATED APPLICATION

This application claims the benefit of U.S. Provisional Patent Application No. 60/636,551 filed Dec. 17, 2004.

BACKGROUND OF THE INVENTION

1. Field of the Invention

The present invention generally relates to variable gain amplifiers, and more specifically to high frequency, variable gain amplifiers with a linear-in-dB gain control.

2. Prior Art

The use of variable gain amplifiers (VGAs) is prevalent, for example, in connection with communications, networking, and other electronic devices. Commonly VGAs may be found in various radio frequency (RF) applications, including the handling of intermediate frequency (IF) and baseband circuits. Many VGAs are designed to provide a constant output signal amplitude even if the input signal amplitude changes. Such changes include the change in the operating parameters of the circuit.

A form of a current-steering VGA 100 is shown with respect to FIG. 1. It comprises an amplifier core of three active devices, transistor 110, transistor 120, and transistor 130. Transistor 110 and transistor 120 form a current mirror stage. The area of transistor 120 is 'm' times the area of transistor 110. Device transistor 110 is biased at a DC current $I_1$ produced by an exponential current source 140, having a control input $V_{ctrl}$. Exponential current sources are well-known in the art and therefore the discussion herein addresses only the usage of such current sources. The collector of transistor 120 is tied to the supply voltage through the load impedance $Z_{load}$ 150. The collector of transistor 130 is tied to the supply voltage while its base is biased at a constant voltage $V_{BIAS}$. This sets the DC voltage of the common emitter connection. In one embodiment, the input signal is applied to the common emitter of the three devices; in another embodiment the input signal is supplied through transconductance amplifier 160. The current $I_2$ is the tail DC bias current. The transconductance amplifier Gm adds the amplified input signal Gm*Vin to the tail DC bias current $I_2$. The AC output signal is taken across impedance 150 at the collector of transistor 120. The input AC signal is divided among devices transistor 110, transistor 120, and transistor 130, according to their emitter admittances $Y_i$, which depend on the bias current of each device.

The transistors draw the following currents: transistor 110 draws $I_1$, transistor 120 draws $m \cdot I_1$, and transistor 130 draws $I_2 - (m+1) \cdot I_1$. Since $Y_i = I_i/V_T$ and the thermal voltage $V_T = KT/q$, the gain of VGA 100 can be reached by using the following equations:

$$V_{out}/V_{in}(dB) = 20 \cdot \log_{10}[Y_{120}/(Y_{110} + Y_{120} + Y_{130}) \cdot G_m \cdot Z_{load}] = 20 \cdot \log_{10}\{m \cdot I_1/[I_1 + m \cdot I_1 + (I_2 - (m+1)]\} \cdot G_m \cdot Z_{load}\} = 20 \cdot \log_{10}[m \cdot G_m \cdot Z_{load} \cdot (I_1/I_2)]$$

While $I_2$ is a fixed current value, i.e., independent of $V_{ctrl}$, $I_1$ has an exponential function dependency of $V_{ctrl}$ such that $I_1 = I_{10} \cdot 10^{(\alpha/20 \cdot V_{ctrl})}$. Substituting this into the gain equation above results in the VGA gain being:

$$V_{out}/V_{in}(dB) = 20 \cdot \log_{10}(m \cdot G_m \cdot Z_{load} \cdot I_{10}/I_2) + \alpha \cdot V_{ctrl}$$

Hence, there is shown a linear-in-dB VGA having a rate of α dB/V. However, even though prior art shows the linear-in-dB capability, the prior art suffers from at least the fact that the current $I_2$ remains constant and hence, regardless of the decrease in gain of the linear-in-dB VGA 100, the $I_2$ current consumption remains the same. It would therefore be advantageous to provide a linear-in-dB VGA that is capable of adjusting $I_2$ current consumption in accordance with the linear-in-dB VGA gain.

DETAILED DESCRIPTION OF THE PREFERRED EMBODIMENTS

The deficiencies of the prior art require a technique that allows the DC bias current of a linear-in-db VGA to decrease as the gain decreases and vice versa. In accordance with the disclosed invention, a technique is shown for the control of the fixed current portion (DC tail current) of a linear-in-dB VGA by providing a second exponential current source (ECS) such that the fixed current is provided by that second ECS. The result of the implementation of the circuit of a VGA in accordance with the disclosed invention is the decrease of current consumption of the circuit with the decrease in gain, which is of particular importance to systems that derive their power from an independent power source, such as a battery.

Figure 1:
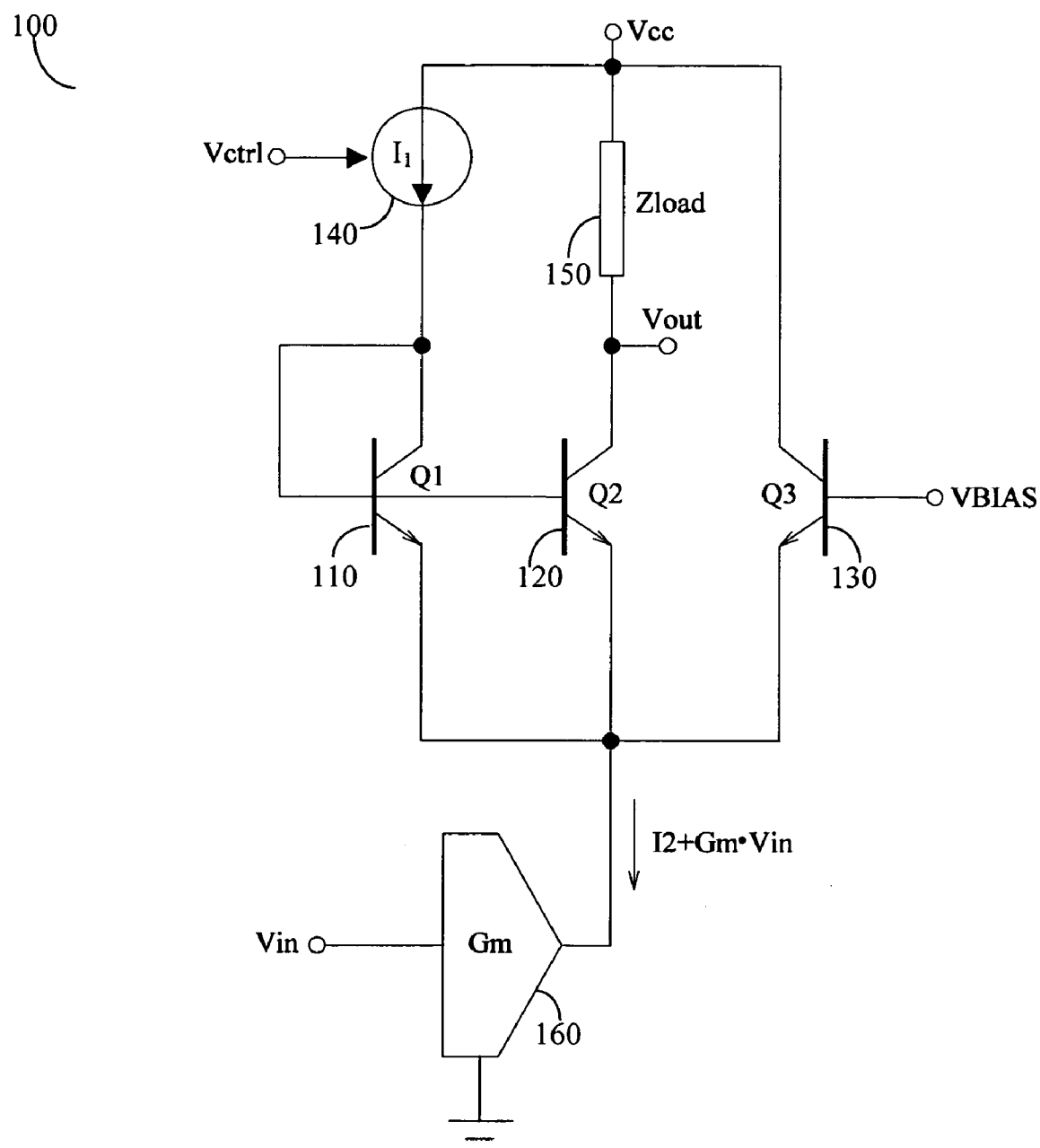
FIG. 1 is a schematic diagram of a prior art linear-in-dB VGA.
Figure 2:
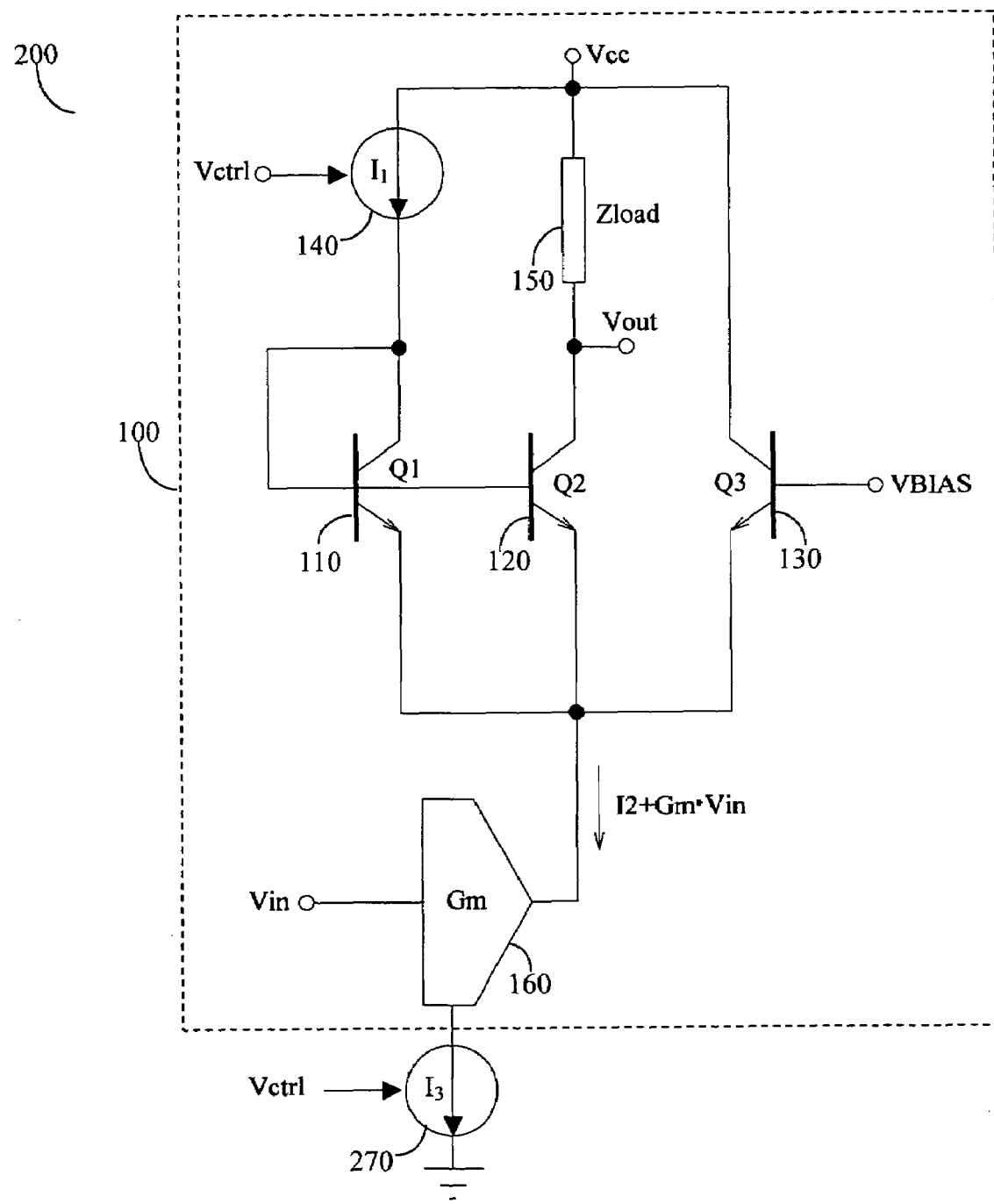
FIG. 2 is a schematic diagram of a linear-in-dB VGA in accordance with the disclosed invention.

Reference is now made to FIG. 2 where an exemplary and non-limiting schematic diagram of a linear-in-dB VGA 200, in accordance with the disclosed invention, is shown. In addition to the components described in detail in connection with FIG. 1, and which form a linear-in-dB VGA 100 amplifier core, there is added an ECS 270 as described in further detail below. In the prior art solutions the current consumption of the fixed-bias VGA, for example VGA 100, is equal to $I_2$ and does not change as the gain of the VGA, for example VGA 100, changes. At low gain settings most of the current $I_2$ flows through transistor 130 and is therefore wasted to the supply. In accordance with the disclosed invention, it is possible to modify the current $I_2$ so that it tracks the current $I_1$ while the gain control characteristics are maintained. This is achieved by providing a variable current $I_3$ from ECS 270. ECS 270 may be of the same design as ECS 140 or not, as desired. In that regard, ECSs of various designs are well known in the prior art, having been used in prior art VGAs for which the present invention is a substantial improvement, as well as elsewhere. In accordance with the modified VGA 200, the input signal is applied to a transconductance stage 160 with a gain $G_m$ that converts the input signal to a current Gm*Vin that is added onto the output $I_3$ of the ECS 270 and then the sum applied to the common emitter of the transistors 110, 120, and 130.

With $I_3$ being an exponential function of $V_{ctrl}$, its function is:

$$I_3 = I_{30} \cdot 10^{(\beta/20 \cdot V_{ctrl})}$$

The gain of modified VGA 200 may then be derived to be:

$$V_{out}/V_{in}(dB) = 20 \cdot \log 10(m \cdot G_m \cdot Z_{load} \cdot I_{10}/I_{30}) + (\alpha - \beta) \cdot V_{ctrl}$$

It is now easily noticed that the gain of VGA 200 is linear-in-dB with a rate of (α−β) dB/V. In this equation, α and β must have the same sign. Either α>β>0 so that α−β>0 (positive gain), or α<β<0 so that α−<0 (attenuation).

The advantage of the modified VGA 200 would now be apparent to those skilled-in-the-art. In particular, at the maximum gain, I3 may equal I2 of the prior art of FIG. 1, but the total bias current consumption of the amplifier is exponentially decreasing at a rate of β dB/V as the gain decreases. As a result, less current is steered to the supply through transistor 130 as compared with the fixed-bias VGA, for example VGA 100. Furthermore, because the rate by which the gain decreases is a function of the difference (α−β), the rate the current $I_3$ decreases can be set independently, allowing for independent optimization of other performance parameters of the circuit. The current savings are extremely important in certain applications, and particularly, for example, in an RF transmitter that, when implementing the VGA circuit in accordance with the disclosed invention, can provide a range of gain control with minimum impact on the overall current consumption. In one non-limiting embodiment of the disclosed invention the value of α is significantly larger than the value of β, for example, β has a value of 10% of that used for α. As a result the linear-in-dB behavior of the exemplary embodiment is predominately the result of the value of α. However, there is still a benefit in the reduction of the current at a rate of β. Specific values of α and β are selected so as to reach the goals of the linear-in-dB behavior of the modified VGA 200 as well as the reduction of the tail DC current required.

The description provided hereinabove is of a single-ended VGA. However other usages of the techniques disclosed by this invention are possible, including but not limited to, differential structures, without departing from the spirit of the disclosed invention. A person skilled-in-the-art would further note that while bipolar NPN transistors are shown herein, this invention is not limited to such an implementation, and would further include, but not limited to, bipolar pnp transistors, metal-oxide semiconductor (MOS) transistors, including but not limited to MOSFETs, and heterojunction bipolar transistors (HBTs), as well as any other transistor devices, without departing from the spirit of the disclosed invention. Thus the transistor symbol shown in the Figures is to be understood to be used in the general sense and not as being limited as to the transistor type usable in the present invention.

What is claimed is:

1. A linear-in-dB variable gain amplifier comprising:
    a linear-in-dB amplifier core, including a first exponential current source; and,
    a second exponential current source coupled to bias the linear-in-dB amplifier core with a current exponentially responsive to a first control signal.

2. The linear-in-dB gain amplifier of claim 1, the linear-in-dB amplifier core comprising:
    a transconductance configured to receive an input signal;
    a current mirror connected to the output of said transconductance, a current of the current mirror being determined by the second exponential current source responsive to a second control signal, said current mirror being coupled to drive the current through a load; and,
    a bias control connected to the output of said transconductance.

3. The linear-in-dB gain amplifier of claim 2, wherein said first control signal and said second control signal are a single control signal that controls the first and second exponential current sources.

4. The linear-in-dB gain amplifier of claim 1, wherein a decrease in the gain of said linear-in-dB gain amplifier results in a decrease of the current of said second exponential current source.

5. The linear-in-dB gain amplifier of claim 1, wherein an increase in the gain of said linear-in-dB gain amplifier results in an increase of the current of said second exponential current source.

6. The linear-in-dB gain amplifier of claim 1, wherein said linear-in-dB amplification core comprises at least one of: a single ended variable gain amplifier, a differential variable gain amplifier.

7. The linear-in-dB gain amplifier of claim 1, wherein said linear-in-dB amplification core comprises at least one of: bipolar transistors, MOS transistors, heterojunction bipolar transistors.

8. A linear-in-dB variable gain amplifier circuit comprising:
    first, second and third transistors each having an emitter, a base and a collector;
    said first and second transistors having their respective emitters coupled to each other and further having their respective bases coupled to each other, the bases of the first and second transistors being further connected to the collector of said first transistor to form a current mirror;
    a first controllable exponential current source connected between a power supply and the collector of said first transistor;
    a load connected between said power supply and said collector of said second transistor;
    a bias transistor having its collector connected to said power supply, its emitter coupled to the emitter of said first transistor, and its base being coupled to a bias voltage;
    a transconductance amplifier capable of converting an input signal to a proportionate current, the output of said transconductance amplifier being coupled to the emitter of said first transistor; and,
    a second controllable exponential current source connected to said transconductance amplifier.

9. The circuit of claim 8, wherein a decrease in the gain of said circuit results in a decrease of the current of said second controllable exponential current source.

10. The circuit of claim 8, wherein an increase in the gain of said circuit results in an increase of the current of said second controllable exponential current source.

11. The circuit of claim 8, wherein said linear-in-dB amplification core comprises at least one of: bipolar transistors, MOS transistors, heterojunction bipolar transistors.

12. The circuit of claim 8, wherein a single control signal controls said first controllable exponential current source and said second controllable exponential current source.

13. A method for controlling the gain in an amplifier, comprising:
    providing a linear-in-dB variable gain amplifier operative on a bias current, linear-in-dB variable gain amplifier having a first controllable exponential current source;
    providing the bias current from a second controllable exponential current source;
    causing the bias current of said linear-in-dB variable gain amplifier to decrease when the gain decreases.

14. The method of claim 13, wherein said method further comprises the step of causing the bias current of said linear-in-dB variable gain amplifier to increase when the gain increases.

* * * * *